(12) United States Patent
Ha (10) Patent No.: US 7,009,910 B2
(45) Date of Patent: Mar. 7, 2006

(54) SEMICONDUCTOR MEMORY HAVING A FLEXIBLE DUAL-BANK ARCHITECTURE WITH IMPROVED ROW DECODING

(75) Inventor: Chang Wan Ha, Pleasanton, CA (US)

(73) Assignee: Winbond Electronics Corporation, Hsinchu (TW)

( * ) Notice: Subject to any disclaimer, the term of this patent is extended or adjusted under 35 U.S.C. 154(b) by 77 days.

(21) Appl. No.: 10/768,398

(22) Filed: Jan. 29, 2004

(65) Prior Publication Data

US 2004/0246806 A1 Dec. 9, 2004

Related U.S. Application Data (63) Continuation-in-part of application No. 10/238,048, filed on Sep. 6, 2002, now Pat. No. 6,704,241, and a continuation-in-part of application No. 09/938,410, filed on Aug. 23, 2001, now Pat. No. 6,781,914.

(51) Int. Cl.
*G11C 8/00* (2006.01)

(52) U.S. Cl. ............................. 365/230.06; 365/185.11; 365/185.13; 365/185.23; 365/230.03

(58) Field of Classification Search ........... 365/185.13, 365/185.11, 185.23, 185.33, 230.03, 230.06
See application file for complete search history.

(56) References Cited

U.S. PATENT DOCUMENTS

| | | | | |
|---|---|---|---|---|
| 5,339,279 | A | * | 8/1994 | Toms et al. ............ 365/185.11 |
| 5,748,528 | A | * | 5/1998 | Campardo et al. ...... 365/185.13 |
| 5,793,676 | A | * | 8/1998 | Bedarida et al. ....... 365/185.12 |
| 5,995,415 | A | * | 11/1999 | Kuo et al. ............. 365/185.11 |
| 6,005,803 | A | * | 12/1999 | Kuo et al. ............. 365/185.11 |
| 6,033,955 | A | * | 3/2000 | Kuo et al. .................. 438/257 |
| 6,552,935 | B1 | * | 4/2003 | Fasoli .................... 365/185.33 |

* cited by examiner

*Primary Examiner*—Son Mai
(74) *Attorney, Agent, or Firm*—Townsend and Townsend and Crew LLP (57) ABSTRACT

A semiconductor memory includes a plurality of memory array partitioned into first and second memory banks in correspondence with one of a plurality of mask options such that the first memory bank includes at least one but less than all of the plurality of memory arrays and the second memory bank includes a corresponding remainder of the plurality of memory arrays. A first horizontal global row decoder is configured to receive a first subset of addresses for the first memory bank and in response provide a first plurality of predecoded row address signals on a first plurality of lines extending only across the at least one but less than all of the plurality of memory arrays. A second horizontal global row decoder is configured to receive a first subset of addresses for the second memory bank and in response provide a second plurality of predecoded row address signals on a second plurality of lines extending only across the corresponding remainder of the plurality of memory arrays.

41 Claims, 6 Drawing Sheets

SEMICONDUCTOR MEMORY HAVING A FLEXIBLE DUAL-BANK ARCHITECTURE WITH IMPROVED ROW DECODING

CROSS-REFERENCE TO RELATED APPLICATIONS

This application is a Continuation-in-part and claims priority from the following two U.S. Applications:

U.S. application Ser. No. 09/938,410, filed Aug. 23, 2001 now U.S. Pat. No. 6,781,914, entitled "Flash Memory Having a Flexible Bank Partition", and U.S. application Ser. No. 10/238,048, filed Sep. 6, 2002 now U.S. Pat. No. 6,704,241, entitled "Memory Architecture with Vertical and Horizontal Row Decoding", the disclosures of which are incorporated herein by reference.

BACKGROUND OF THE INVENTION

The present invention relates in general to semiconductor memory technology, and more particularly to semiconductor memory having a flexible dual-bank architecture capable of performing two simultaneous memory operations with improved row decoding scheme.

Electronic systems often include a processor and memory. The memory in these electronic systems stores program instructions for the processor (i.e. code) and data. In many systems the code and/or data must be retained when power to the system is withdrawn. A type of memory that is capable of retaining the information stored therein even when the power is removed is known as semiconductor non-volatile memory. Some electronic devices which use non-volatile memory include personal computers, personal digital assistants, cellular telephones, digital cameras. For examples, a cellular telephone uses non-volatile memory to store telephone numbers and a personal computer uses non-volatile memory to store the computer's BIOS (basic input/output system).

There are a variety of semiconductor non-volatile memory types. One commonly used type is flash memory. Flash memories have a memory array of flash cells arranged in rows (wordlines) and columns (bitlines). A limitation of conventional flash memories relates to the differences in time it takes to perform a read operation compared to the time it takes to perform either a program operation or an erase operation. Program and erase cycles for typical flash memory devices are typically much longer than read access times. This disparity limits the speed of operation of systems in which such a memory is used.

To overcome this problem, a modified flash memory device, known as a simultaneous operation flash memory device, has been developed. In a typical simultaneous operation flash memory device, the flash memory array is partitioned into an upper memory bank and a lower memory bank. The upper and lower memory banks are normally used for different purposes. For example, the upper memory bank may be used for code storage, whereas the lower memory bank may be used for data storage. Although the simultaneous operation flash memory device is an improvement, it has a limitation of its own in that the partitioning of the upper and lower banks is fixed in the design. Such memory devices are, therefore, limited to applications that are compatible with the fixed memory partition.

To overcome the rigidity of the fixed memory partition scheme, a flexible bank partition technique has been used. In this technique, bit lines of the memory array are flexibly partitioned to form upper and lower memory banks. Because the bit lines of the memory array are split to make the partition, however, an additional column decoder (i.e. y-decoder) is required to implement the design. This not only renders the design and layout more complex, it also limits the area available for forming the memory array portion of the memory device.

Many applications for such simultaneous operation memory require a large amount of memory manufactured in a cost-effective manner. To manufacture such large memory cost effectively, the silicon area consumed by the memory needs to be minimized. Memory cell size is continuously being reduced to achieve such silicon area reduction. If the continued efforts in reducing the cell size are not accompanied by similar efforts in reducing the size of the periphery circuits which interface with the memory array, the silicon area consumed by the periphery circuit becomes the bottleneck in achieving smaller silicon area.

Row decoder is one of the circuit blocks which interfaces with the memory array. Conventionally, the wordline (row) path of a memory includes address buffers driving row predecoder which in turn drive the row decoder. The address buffer and row predecoder are generally located in the periphery area of a memory and do not physically interface with the memory array. However, the row decoder conventionally extends along one side or through the center of the memory array. With a reduction in the cell size, the memory cell pitch within which the row decoder needs to be formed (laid out) is equally reduced. Thus, to achieve an effective overall area reduction, the row decoder needs to be reduced in size.

Conventional row decoders include multi-decoding stages. In, for example, a three-stage row decoding scheme, a first decoding stage receives a first group of predecoded row address signals and in response selects a group of the decode logic in the second decoding stage. The second decoding stage, in addition to the signal(s) from the first decoding stage, receives a second set of predecoded row address signals and in response selects one of a group of wordline drivers which form the third decoding stage. The third decoding stage, in addition to the signal(s) from the second decoding stage, may receive a third set of predecoded row address signals and in response selects a wordline in one or more memory arrays.

Many row decoding schemes for minimizing the size of the row decoder, for example by reducing the number of transistors in one or more of the three decoding stages of the row decoder, have been proposed and used. Although such reduction in the number of transistors results in a smaller row decoder, no technique has been proposed which yields a substantial reduction in the silicon area consumed by the row decoder.

Thus, there is a need for a new flexible memory architecture capable of simultaneous operations and which includes a row decoding scheme resulting in a significant reduction in the silicon area consumed by the row decoder.

SUMMARY OF THE INVENTION

In accordance with an embodiment of the invention, a semiconductor memory includes a plurality of memory arrays each having a plurality of memory cells arranged along rows and columns. The plurality of memory arrays are partitioned into first and second memory banks in correspondence with one of a plurality of mask options such that the first memory bank includes at least one but less than all of the plurality of memory arrays and the second memory bank includes a corresponding remainder of the plurality of memory arrays. The semiconductor memory further includes a row selection circuitry which in turn includes first and second horizontal global row decoders. The first horizontal global row decoders are configured to receive a first subset of addresses for the first memory bank and in response provide a first plurality of predecoded row address signals on a first plurality of lines extending only across the at least one but less than all of the plurality of memory arrays. The second horizontal global row decoder are configured to receive a first subset of addresses for the second memory bank and in response provide a second plurality of predecoded row address signals on a second plurality of lines extending only across the corresponding remainder of the plurality of memory arrays.

In one embodiment, the semiconductor memory further includes a column selection circuitry which in turn includes first and second column predecoders. The first column predecoder is configured to receive column addresses for the first memory bank and in response provide a first plurality of predecoded column address signals. The second column predecoder is configured to receive column addresses for the second memory bank and in response provide a second plurality of predecoded column address signals. The column selection circuitry further includes a plurality of column decoders each coupled to select a predetermined number of columns from one of the plurality of memory arrays. In accordance with the one of a plurality of mask options: (i) at least one but less than all of the plurality of column decoders receive the first plurality of predecoded column address signals, and (ii) a corresponding remainder of the plurality of column decoders receive the second plurality of predecoded address signals.

In another embodiment, the row selection circuitry further includes a plurality of horizontal local row decoders each being coupled to one of the plurality of memory arrays, and a plurality of vertical global row decoders each being coupled to one of the plurality of horizontal local row decoders. Each of the plurality of vertical global row decoders is configured to provide a third plurality of predecoded row address signals on a third plurality of lines extending through a corresponding one of the plurality of horizontal local row decoders.

In another embodiment, the row selection circuitry further includes a plurality of vertical local row decoders each coupled to one of the plurality of horizontal local row decoders. Each of the plurality of vertical local row decoders is configured to provide a fourth plurality of predecoded row address signals on a fourth plurality of lines extending through a corresponding one of the plurality of horizontal local row decoders.

In another embodiment, in accordance with the one of a plurality of mask options: (i) at least one but less than all of the plurality of vertical global row decoders receive a second subset of the addresses for the first memory bank, and a corresponding remainder of the vertical global row decoders receive a second subset of the addresses for the second memory bank, and (ii) at least one but less than all of the plurality of vertical local row decoders receive a third subset of the addresses for the first memory bank, and a corresponding remainder of the vertical local row decoders receive a third subset of the addresses for the second memory bank.

In another embodiment, the semiconductor memory further includes an array select predecoder configured to receive a fourth subset of each of the addresses for the first and second memory banks in accordance with the one of a plurality of mask options and in response provide a plurality of output signals coupled to the plurality of vertical global row decoders so as to select one memory array in each of the first and second memory banks.

In accordance with another embodiment of the invention, a semiconductor memory includes a plurality of memory arrays partitioned into first and second memory banks in correspondence with one of a plurality of mask options such that the first memory bank includes at least one but less than all of the plurality of memory arrays and the second memory bank includes a corresponding remainder of the plurality of memory arrays. A method of operating the semiconductor memory is as follows: a first plurality of predecoded row address signals is generated on a first plurality of lines extending only across the at least one but less than all of the plurality of memory arrays in response to a first subset of addresses for the first memory bank being provided to a first horizontal global row decoder. A second plurality of predecoded row address signals are generated on a second plurality of lines extending only across the corresponding remainder of the plurality of memory arrays in response to a first subset of addresses for the second.

In accordance with yet another embodiment of the present invention, a semiconductor memory includes a plurality of memory arrays and a row selection circuitry comprising a first horizontal global row decoder configured to provide a first plurality of predecoded row address signals on a first plurality of lines, and a second horizontal global row decoder configured to provide a second plurality of predecoded row address signals on a second plurality of lines. A method of operating the semiconductor memory is as follows: one of a plurality of mask options is applied to partition the plurality of memory arrays into first and second memory banks such that: (i) the first memory bank includes at least one but less than all of the plurality of memory arrays and the second memory bank includes a corresponding remainder of the plurality of memory arrays, and (ii) the first plurality of lines extend only across the at least one but less than all of the plurality of memory arrays, and the second plurality of lines extend only across the corresponding remainder of the plurality of memory arrays.

A further understanding of the nature and the advantages of the inventions disclosed herein is described now in reference to the remaining portions of the specification and the attached drawings.

DETAILED DESCRIPTION OF THE INVENTION

Figure 1:
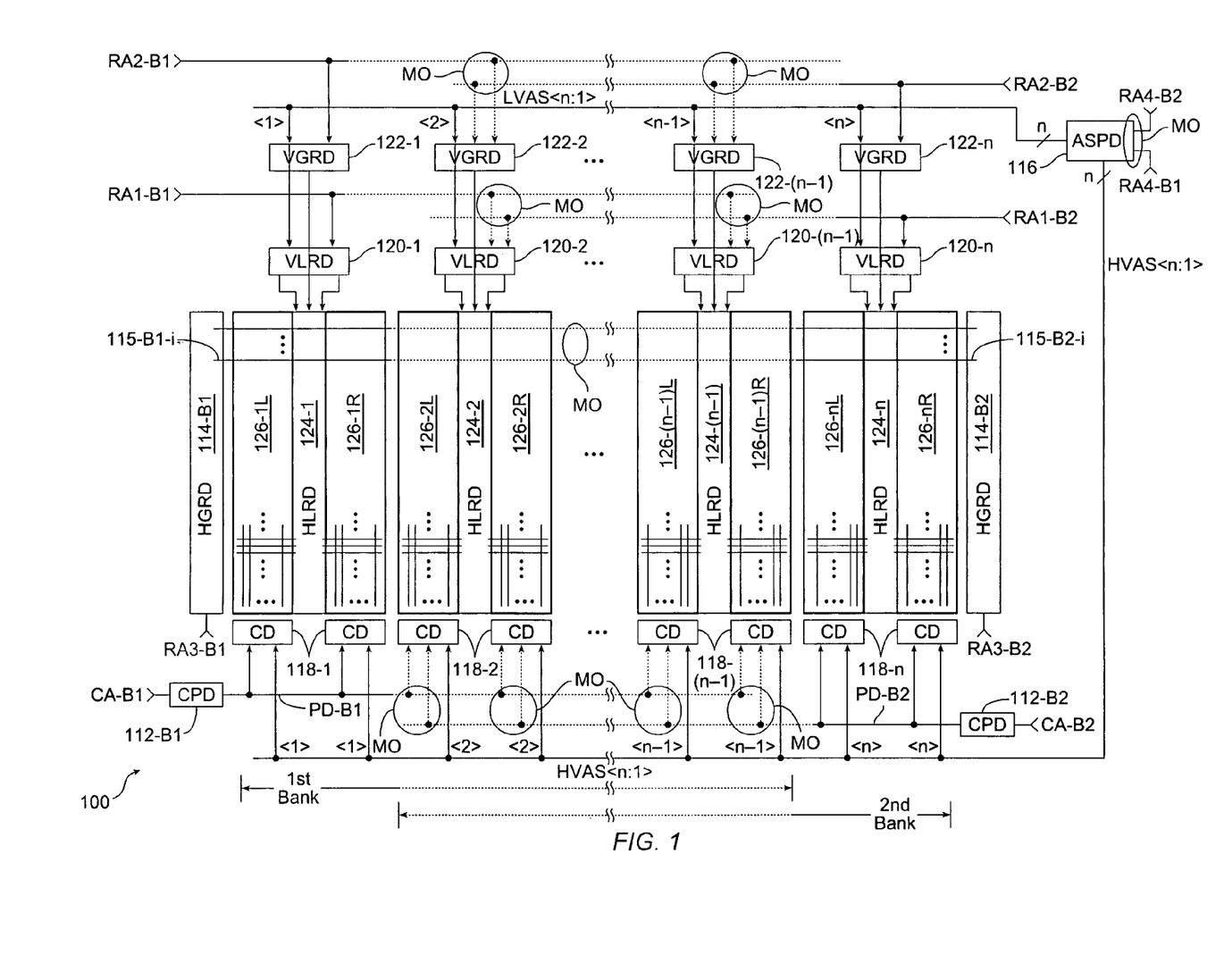
FIG. 1 shows a block diagram of a semiconductor memory 100 having a flexible dual-bank architecture with improved row decoding in accordance with an embodiment of the invention.

FIG. 1 shows a block diagram of a semiconductor memory 100 having a flexible dual-bank architecture with improved row decoding in accordance with an embodiment of the invention. Each of the two banks in the flexible dual bank architecture can be configured to have one of a predefined number of memory arrays using metal mask options. This is achieved using a highly efficient row decoding scheme resulting in area savings and improved performance. The partition between the first and second banks is varied by selecting and applying a different metal mask during the manufacturing process. The mask is selected from a plurality of preformed masks which differ from one another by how the row and column addresses for each of the two banks and the predecoded address signals are coupled to other blocks. In effect, each mask configures the row and column decode circuitries differently. The metal masks are formed using conventional techniques.

The memory architecture and row decoding technique shown in FIG. 1 can be modified by one skilled in this art to implement any density and type of memory in view of the present disclosure. Memory 100 may be a stand-alone memory or an embedded memory.

Memory 100 comprises n memory arrays 126-1 through 126-n. Each memory array has a central horizontal local row decoder (HLRD) 124 dividing the memory array into left and right sub-arrays. For example, HLRD 124-1 divides memory array 126-1 into a left sub-array 126-1L and right sub-array 126-1R. Note that the invention is not limited to this particular array configuration, and other known memory configurations, such as placing the HLRD along one side of the memory array, may be used depending on the design and performance goals. Each memory sub-array has a predefined number of memory cells arranged along rows and columns generally depicted in each memory sub-array by the horizontally and vertically extending lines, respectively.

A first horizontal global row decoder (HGRD) 114-B1 for bank 1 is located along the far left side of memory arrays 126, and a second HGRD 114-B2 for bank 2 is located along the far right side of memory arrays 126. HGRD 114-B1 receives bank 1 row addresses RA3-B1, and provides predecoded row address signals on a predetermined number of groups of global lines 115-B1-$i$ extending horizontally across one or more of the n arrays in accordance with the desired partitioning of the memory arrays. More specifically, global lines 115-B1-$i$ make electrical contact in HLRD 124-1, and depending on the desired partitioning of the memory arrays, may also make electrical contact in one or more of HLRDs 124-2 through 124-(n-1). Similarly, HGRD 114-B2 receives bank 2 row addresses RA3-B2, and provides predecoded row address signals on a predetermined number of groups of global lines 115-B2-$i$ extending horizontally across one or more of the n arrays. Global lines 115-B2-$i$ make electrical contact in HLRD 124-n, and depending on the desired partitioning of the memory arrays, may also make electrical contact in one or more of HLRDs 124-(n-1) through 124-2.

An array select predecoder (ASPD) 116 predecodes bank 1 row addresses RA4-B1 and bank 2 row addresses RA4-B2, and outputs n low-voltage array select signals LVAS<n:1>. These n signals are provided on n interconnect lines extending horizontally along the top. In each access to memory 100, ASPD 116 operates to select two of the n signals LVAS<n:1>. The two selected signals, in effect, respectively select one array from the array(s) in each of the two banks. Depending on the desired partitioning of the n arrays between the two banks, a metal mask option is selected for ASPD 116. This is described in more detail further below in reference to FIG. 6.

Along the top of FIG. 1, n vertical global row decoders (VGRD) 122-1 through 122-n are shown. Extending directly above the VGRDs are two row address buses. The upper one of the two address buses carries row addresses RA2-B1 for bank 1, and the lower one carries row addresses RA2-B2 for bank 2. Row address bus RA2-B1 is coupled to VGRD 122-1, and depending on the desired bank partitioning may also be coupled to one or more of VGRDs 122-2 through 122-(n-1). Similarly, row address bus RA2-B2 is coupled to VGRD 122-n, and depending on the desired bank partitioning may also be coupled to one or more of VGRDs 122-(n-1) through 122-2. Also, VGRDs 122-1 through 122-n receive signals LVAS<1> through LVAS<n>, respectively. Row address bus lines RA2-B1 and RA2-B2, as well as others in FIG. 1, are depicted as being partially solid and partially dashed. Dashed line portions represent those portions of these bus lines that are metal mask optionable. These dashed line portions of the address busses along with the dashed line arrows define possible interconnections which are metal mask optionable, i.e., these interconnections may be made depending on the selected metal mask reflecting the desired bank partition. Circles and ovals marked as metal option MO are used to show these mask optionable interconnections. Thus, depending on the desired partitioning of arrays 126-1 through 126-n between the two banks, a corresponding mask option is selected during the manufacturing process.

Each VGRD decodes the row addresses it receives to select one of a predetermined number of signals output by the VGRD. However, of the n VGRDs, only two are enabled by the selected two of the LVAS<n:1> signals. The interconnect lines carrying the VGRD output signals extend vertically through corresponding HLRDs. For example, output lines of VGRD 122-1 extend vertically through and make electrical contacts in HLRD 124-1.

Also, along the top of FIG. 1, n vertical local row decoders (VLRD) 120-1 through 120-n are shown. Extending directly above the VLRDs are two row address buses. The upper one of the two buses carries row addresses RA1-B1 for bank 1, and the lower one carries row addresses RA1-B2 for bank 2. Row address bus RA1-B1 is coupled to VLRD 120-1, and depending on the desired bank partitioning may also be coupled to one or more of VLRDs 120-2 through 120-(n-1). Similarly, row address bus RA1-B2 is coupled to VLRD 120-n, and depending on the desired bank partitioning may also be coupled to one or more of VLRDs 120-(n-1) through 120-2.

Each VLRD decodes the row addresses it receives to select one of a predetermined number of signals output by the VLRD. However, similar to the VGRDs, of the n VLRDs, only two are enabled by the selected two of the LVAS<n:1> signals. The interconnect lines carrying the VLRD output signals extend vertically through corresponding HLRDs. For example, output lines of VLRD 120-1 extend through and make electrical contacts in HLRD 124-1.

The row selection in bank 1 is as follows. In response to row addresses RA3-B1, HGRD 114-B1 selects one signal from the groups of signals carried on lines 115-B1-$i$. In response to row addresses RA2-B1 and RA4-B1, the enabled one of the bank 1 VGRDs selects one of the signals at its output. A partial decode circuit (not shown) in the corresponding HLRD receives the selected one of the output signals from the enabled VGRD and the selected signal from the groups of signals carried on lines 15-B1-*i*, and in response selects one of a number of groups of wordline drivers (not shown) in the HLRD. In response to row addresses RA1-B1, the VLRD corresponding to the enabled VGRD selects one of its output signals. In response to the selected output signal of the VLRD, a wordline driver in the selected group of wordline drivers selects a corresponding wordline. The row selection in bank 2 occurs in a similar manner.

Column predecoders CPD 112-B1, 112-B2 and column decoders CD 118-1 through 118-*n* are shown along the bottom of FIG. 1. Column predecoder CPD 112-B1 receives bank 1 column addresses CA-B1 and in response generates predecoded signals on PD-B1 bus for bank 1. Similarly, column predecoder CPD 112-B2 receives bank 2 column addresses CA-B2 and in response generates predecoded signals on PD-B2 bus for bank 2. Buses PD-B1 and PD-B2 extend horizontally below CDs 118-1 through 118-*n*. The PD-B1 bus is coupled to CD 118-1, and depending on the desired bank partitioning may also be coupled to one or more of CDs 118-2 through 118-(*n*-1). Similarly, PD-B2 bus is coupled to CD 118-*n*, and depending on the desired bank partitioning may also be coupled to one or more of CDs 118-(*n*-1) through 118-2. Along the bottom of memory 100, similar to the top, dashed lines and dashed arrow lines along with circles and ovals marked as metal option column MO are used to show mask optionable interconnections.

Column decoders CD 118-1 through 118-*n* are coupled to the bitlines in respective memory arrays. For example, CD 118-1 is coupled to the bitlines in array 126-1. Each CD 118 receives predecoded signals from one of buses PD-B1 and PD-B2 and in response selects a predetermined number of the bitlines in the corresponding array. In one embodiment, the number of selected bitlines in a given array equals the width of the output bus of memory 100. For example, if memory 100 has a 16 bit wide output bus, in each memory access, two of CD blocks 118-1 through 118-*n* (one for each bank) selects 16 columns from the corresponding arrays 126-1 through 126-*n*.

Array select predecoder (ASPD) 116 predecodes bank 1 row addresses RA4-B1 and bank 2 row addresses RA4-B2, and outputs n high voltage array-select signals HVAS<n:1>. These n signals are provided on n interconnect lines extending horizontally along the bottom. In each access to memory 100, ASPD 116 selects two of the n signals HVAS<n:1>. The two selected signals, in effect, respectively select one array from the array(s) in each of the two banks via CDs 118. The two selected arrays correspond to the same two arrays selected by low voltage array-select signals LVAS<n:1>. As indicated above, depending on the desired partitioning of the n arrays between the two banks, an appropriate metal mask option is selected for ASPD 116. This is described in more detail further below in reference to FIG. 6.

Figure 2:
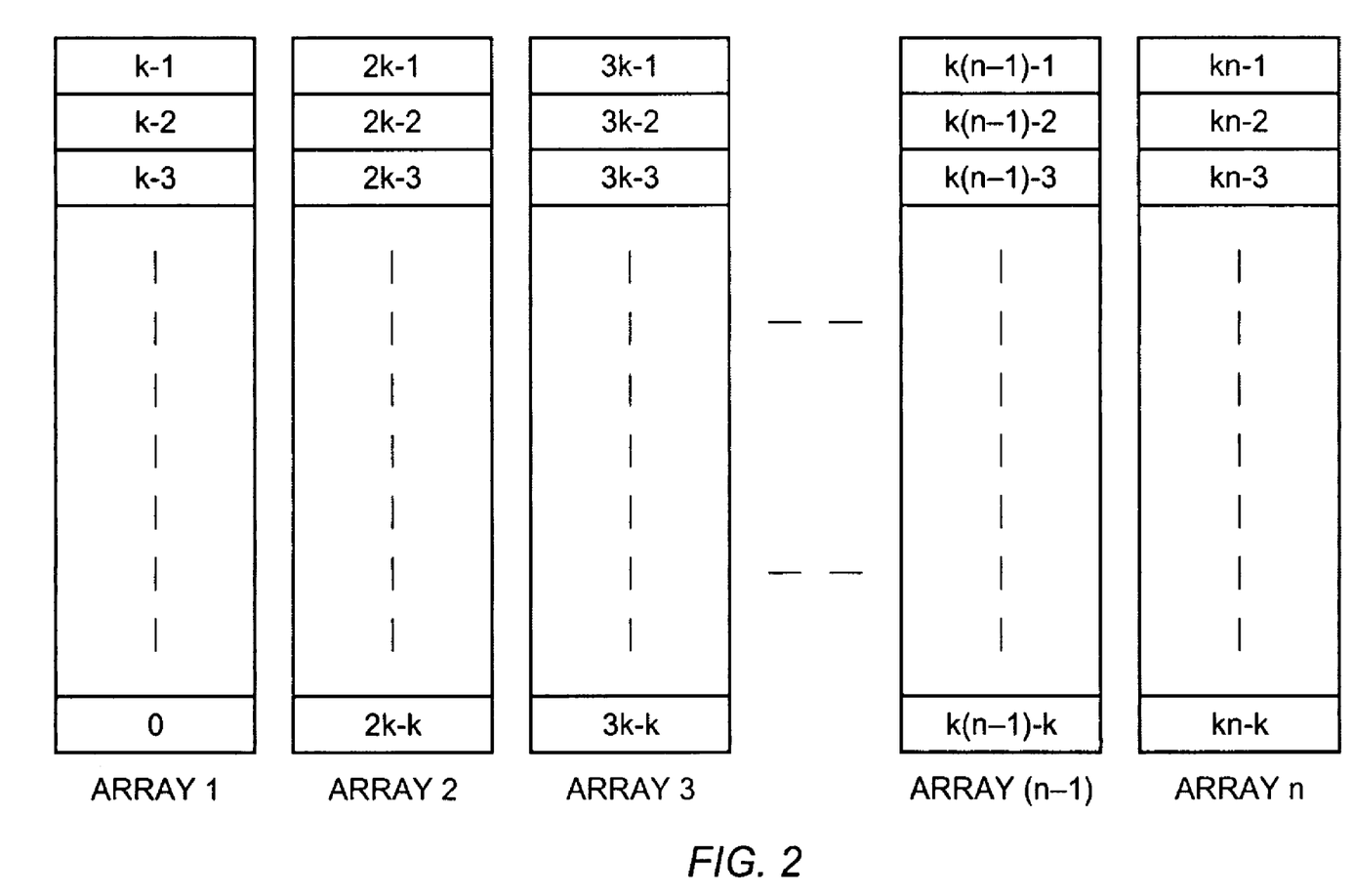
FIG. 2 shows each of the n arrays in FIG. 1 being divided into k sectors.

Each of memory arrays 126-1 through 126-*n* may be divided into a predefined number of sectors. FIG. 2 shows an example wherein each of the n arrays is divided into k sectors. With k sectors per array, the number of addresses required to define the starting address of each sector is log2[k(n)]. Each sector of an array may be further divided into a predefined number of data input/output (data I/O) words. Accordingly, if the data I/O word length of memory device 100 is z bits long, then log2(n/z) bit address lines are required to address the start of each word in the array.

As indicated above, dashed lines and dashed arrows are used to illustrate the flexible bank partition aspect of the architecture. The very last two horizontally-extending dashed/solid lines in FIG. 1 are intended to show how the n memory arrays may be partitioned between banks 1 and 2. The solid portion of the upper one of the two dashed/solid lines indicates that the first bank includes, at a minimum, memory array 126-1, and its dashed portion indicates that the first bank may additionally include one or more of arrays 2 through n−1 depending on the desired partitioning. Similarly, the solid portion of the lower one of the two dashed/solid lines indicates that the second bank includes, at a minimum, memory array 126-*n*, and its dashed portion indicates that the second bank may additionally include one or more of arrays n−1 through array 2 depending on the desired partitioning. Once the desired partitioning of the arrays is determined, a corresponding metal mask option is selected.

While the minimum possible sizes for each of the first and second memory banks has been indicated as one array, in practice, each metal mask option results in partitioning all memory arrays 126-1 through 126-*n* between the two memory banks. For example, if a selected mask option results in the first memory bank having the minimum size memory array 126-1, then the second memory bank would have the remaining memory arrays 126-2 through 126-*n*; or, if the first memory bank has memory arrays 126-1 and 126-2, the second memory bank would have the remaining memory arrays 126-3 through 126-*n*.

As an example, if it is desired that memory bank 1 have memory array 126-1 and memory bank 2 have the remaining memory arrays 126-2 through 126-*n*, the metal mask option which results in the following interconnections would be selected: PD-B1 bus is coupled to CD 118-1, and PD-B2 bus is coupled to CDs 118-2 through 118-*n*; RA1-B1 bus is coupled to VLRD 120-1 and RA1-B2 is coupled to VLRDs 120-2 through 120-*n*; RA2-B1 bus is coupled to VGRD 122-1 and RA2-B2 is coupled to VGRDs 122-2 through 122-*n*; global lines 115-B1-*i* make electrical contact in HLRD 124-1 and global lines 115-B2-*i* make electrical contact in HLRDs 124-2 through 124-*n*; and the RA4-B1 and RA4-B2 are coupled to ASPD such that in each memory access LVAS<1> and HVAS<1> are selected, and one of LVAS<n:2> along with one of HVAS<n:2> are selected.

Figure 3A:
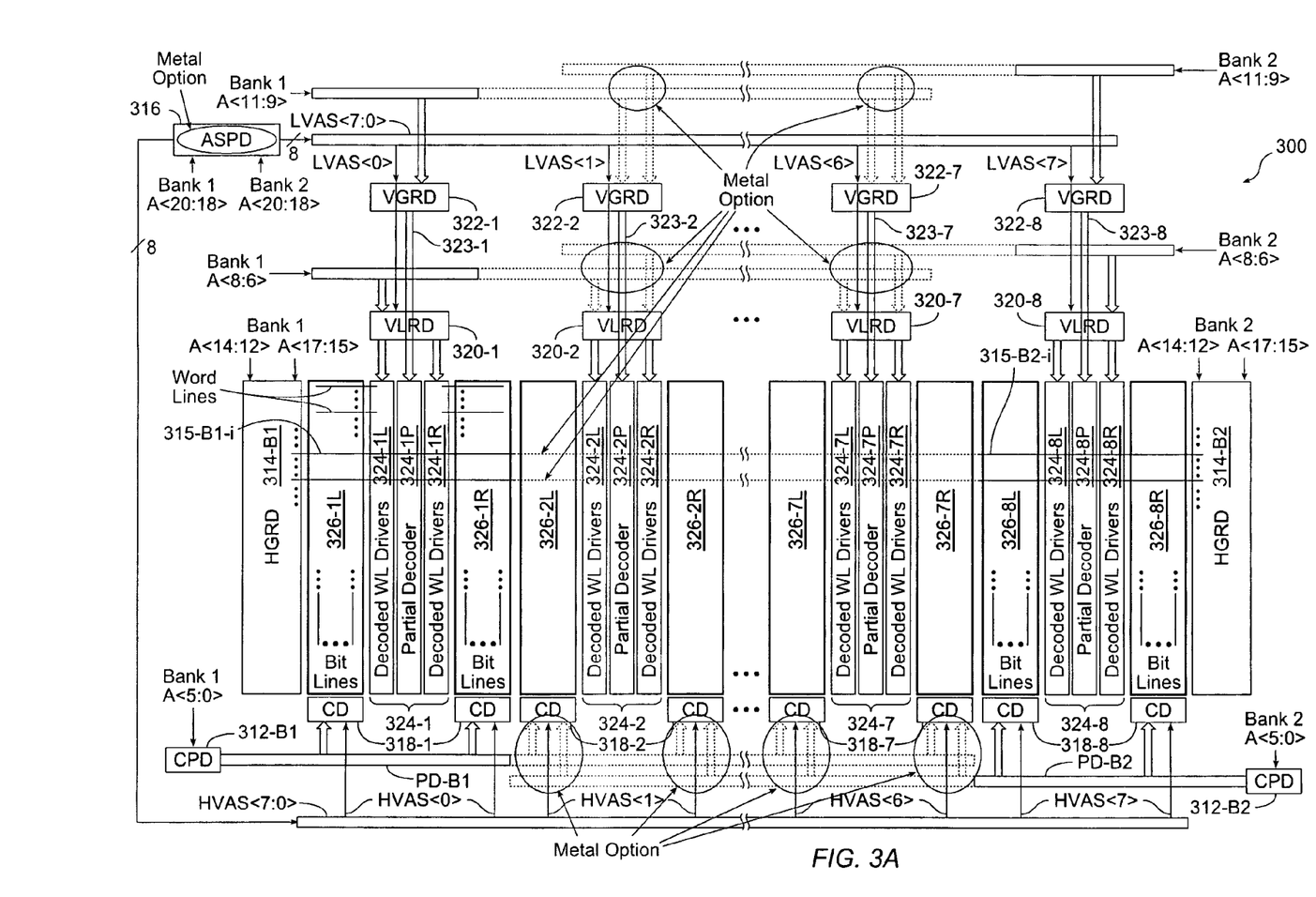
FIG. 3A shows a block diagram of a 32 Mb memory having a flexible dual-bank architecture in accordance with an exemplary embodiment of the present invention.

FIG. 3A shows the dual bank architecture implemented for an 8×4 Mb (i.e., 32 Mb) memory 300 in accordance with an exemplary embodiment of the present invention. Memory 300 includes eight 4 Mb arrays 326-1 through 326-8. Each memory array has a central horizontal local row decoder (HLRD) 324 dividing the memory array into left and right sub-arrays. For example, HLRD 324-1 divides memory array 326-1 into left sub-array 326-1L and right sub-array 326-1R. Each memory sub-array has 4,096 rows by 512 columns of memory cells generally depicted in each memory sub-array by the horizontally and vertically extending lines, respectively.

Figure 4:
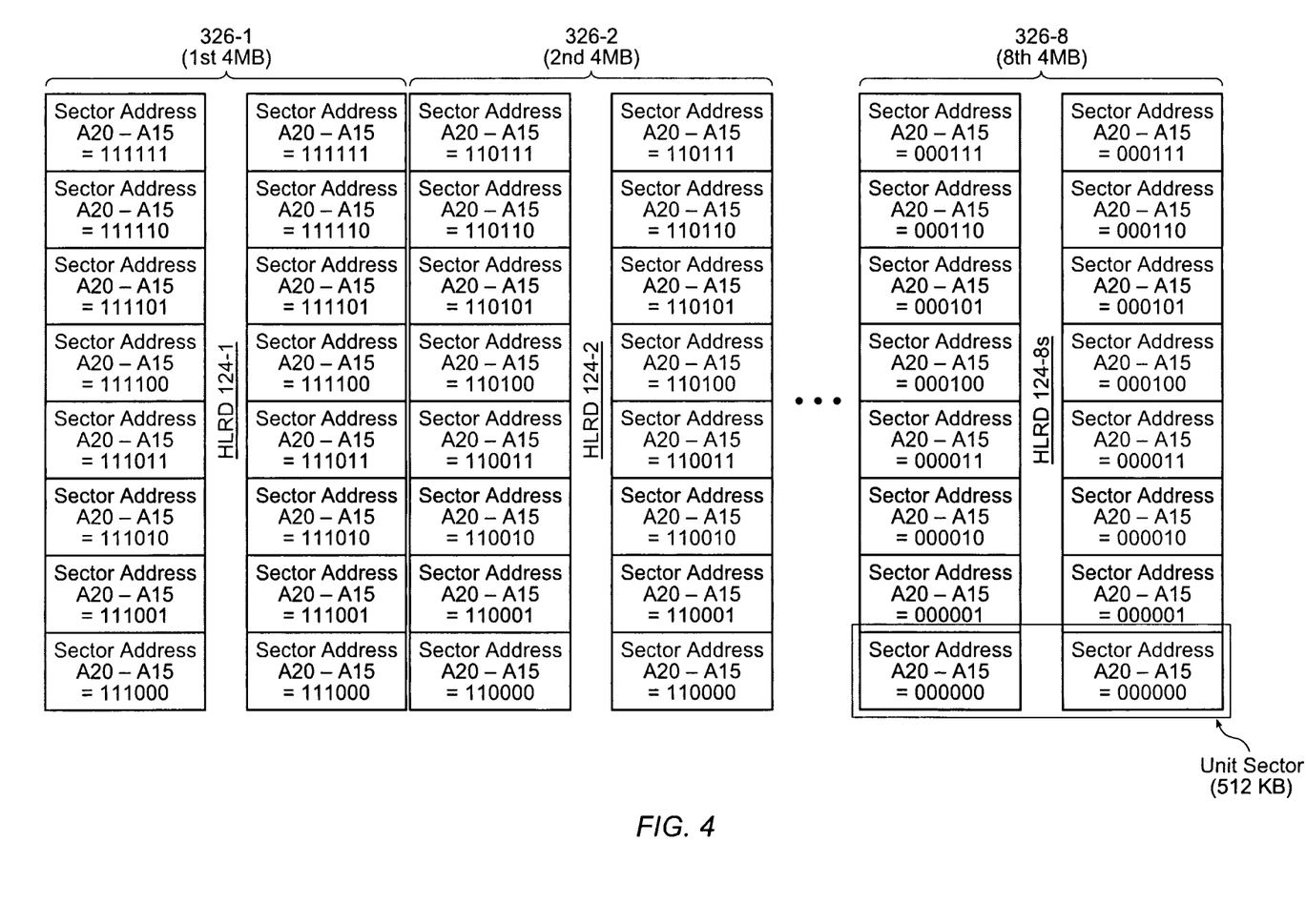
FIG. 4 shows a sector address memory map of the FIG. 3A memory.

Each of memory arrays 326-1 through 326-8 is divided into eight sectors as shown in FIG. 4. Each sector has 512 rows by 1024 columns of memory cells (i.e., there are 64 KB of memory cells per sector). Each sector is broken up into left and right sub-sectors by the corresponding HLRD. With eight memory arrays, there are log2[k(N)]=log2(64)=6 address lines which address the starting addresses of the sixty-four sectors. In this example, and as shown in the sector address memory map in FIG. 4, address lines A15 through A20 are used for this purpose. Each sector of memory arrays 326-1 through 326-8 is further divided into a predefined number of data input/output words of 16-bit length each. Accordingly, log2(n/z)=log2(1024/16)=6 bit address lines (shown as A0–A5 in FIG. 3A) and log2(4096/

8)=9 address lines (shown as A6–A14 in FIG. 3A) are used to address the words within a selected array.

Figure 5:
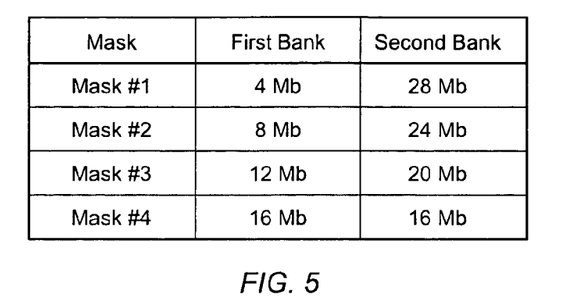
FIG. 5 shows a number of possible partitioning of the eight memory arrays into first and second banks for the 32 Mb memory in FIG. 3A according to an exemplary embodiment of the present invention.

In an exemplary embodiment, the eight 4 Mb arrays 326-1 through 326-8 may be partitioned to form four possible bank1/bank2 partitions each of which is realized by selecting from one of four metal masks. This is shown in FIG. 5 where mask # 1 would be chosen to form a 4 Mb/28 Mb partition, mask # 2 would be chosen to form an 8 Mb/24 Mb partition, mask # 3 would be chosen to form a 12 Mb/20 Mb partition, and mask # 4 would be chosen to form a 16 Mb/16 Mb partition. Many other partitions may be implemented depending on the desired design goals.

In FIG. 3A, each HLRD 324-$i$ includes a partial decoder 324-$i$P and two decoded WL drivers 324-$i$R and 324-$i$L. For example, HLRD 324-1 includes a partial decoder 324-1P and two decoded WL drivers 324-1R and 324-1L. Partial decoder 324-1P receives the signal lines from VGRD 322-1 and HGRD 314-B1 and in response selects one of a group of word-line drivers (not shown) in each of decoded WL drivers 324-1R and 324-1L. The selected group of wordline drivers in each of decoded WL drivers 324-1R and 324-1L then receives the signal lines from VLRD 320-1 to select a wordline from each of sub-arrays 326-1L and 326-1R.

A first horizontal global row decoder (HGRD) 314-B 1 for bank 1 is located along the left side of memory array 326-1, and a second HGRD 314-B2 for bank 2 is located along the right side of memory array 326-8. HGRD 314-B1 receives bank 1 row addresses A<14:12> and A<17:15>, and provides predecoded row address signals on eight groups of global signal lines 315-B1-1 through 315-B1-8 (represented in FIG. 3 by reference numeral 315-B1-$i$) extending horizontally across one or more of the 8 arrays in accordance with the desired partitioning of the memory arrays. More specifically, global signal lines 315-B1-$i$ make electrical contact in partial decoder 324-1P, and depending on the desired partitioning of the memory arrays, may also make electrical contact in one or more of partial decoders 324-2P through 324-7P. Each of the eight groups of global signal lines 315-B1-1 through 315-B1-8 includes eight signal lines. Addresses A<17:15> are decoded to select one of the eight groups of global signal lines 315-B1-$i$, and addresses A<14:12> are decoded to select one of the eight signal lines in the selected group of global signal lines. Although HGRD 314-B1 is shown as directly receiving addresses A<17:12>, these addresses may be predecoded via predecode circuits and then the predecoded signals be provided to HGRD 314-B1.

Similarly, HGRD 314-B2 receives bank 2 row addresses A<14:12> and A<17:15>, and provides predecoded row address signals on a predetermined number of groups of global signal lines 315-B2-$i$ extending horizontally across one or more of the 8 arrays. Global signal lines 315-B2-$i$ make electrical contact in partial decoder 324-8P, and depending on the desired partitioning of the memory arrays, may also make electrical contact in one or more of partial decoders 324-7P through 324-2P. Addresses A<14:12> and A<17:15> for bank 2 are decoded similarly to those for bank 1.

An array select predecoder (ASPD) 316 predecodes bank 1 row addresses A<20:18> and bank 2 row addresses A<20:18>, and outputs 8 low voltage array select signals LVAS<8:1>. These 8 signals are provided on 8 interconnect lines extending horizontally along the top. In each access to memory 300, ASPD 316 selects two of the 8 signals LVAS<8:1>. The two selected signals, in effect, respectively select one array from the array(s) in each of the two banks (i.e., wordlines in only two of the eight arrays are selected in a given memory access). Depending on the desired partitioning of the 8 arrays between the two banks, a metal mask option is selected for ASPD 316. This is described in more detail further below in reference to FIG. 6.

Along the top of FIG. 3, 8 vertical global row decoders (VGRD) 322-1 through 322-8 are shown. Extending directly above the VGRDs are two row address buses. The lower one of the two buses carries row addresses A<11:9> for bank 1, and the upper one carries row addresses A<11:9> for bank 2. The lower row address bus for bank 1 is coupled to VGRD 322-1, and depending on the desired bank partitioning may also be coupled to one or more of VGRDs 322-2 through 322-7. Similarly, the upper row address bus for bank 2 is coupled to VGRD 322-8, and depending on the desired bank partitioning may also be coupled to one or more of VGRDs 322-7 through 322-2. Also, VGRDs 322-1 through 322-8 receive signals LVAS<1> through LVAS<8>, respectively. Each of VGRDs 322-1 through 322-8 decodes the row addresses A<11:9> it receives to select one of eight signals at its output. However, of the eight VGRDs, only two are enabled by the selected two of the LVAS<8:1> signals. The eight interconnect lines 323-$i$ carrying the eight output signals of each VGRD 322-$i$ extend vertically through the corresponding partial decoder. For example, output lines 323-1 of VGRD 322-1 extend through and make electrical contacts in partial decoder 324-1P.

As in FIG. 1, row address buses A<11:9> for banks 1 and 2, as well as others in FIG. 3, are depicted as being partially solid and partially dashed. Dashed line portions represent those portions of these bus lines that are metal mask optionable. These dashed line portions of the address busses along with the dashed line arrows define possible interconnections which are metal mask optionable. Circles and ovals are used to show these mask optionable interconnections. Thus, depending on the desired partitioning of arrays 326-1 through 326-8 between the two banks, a corresponding metal mask option is selected during the manufacturing process.

Also, along the top of FIG. 1, eight vertical local row decoders (VLRD) 320-1 through 320-8 are shown. Extending directly above the VLRDs are two row address buses. The lower one of the two buses carries row addresses A<8:6> for bank 1, and the upper one carries row addresses A<8:6> for bank 2. The lower row address bus A<8:6> for bank 1 is coupled to VLRD 320-1, and depending on the desired bank partitioning may also be coupled to one or more of VLRDs 320-2 through 320-7. Similarly, the upper row address bus A<8:6> for bank 2 is coupled to VLRD 320-8, and depending on the desired bank partitioning may also be coupled to one or more of VLRDs 320-7 through 320-2. Also, VLRDs 320-1 through 320-8 receive signals LVAS<1> through LVAS<8>, respectively.

Each VLRD decodes the row addresses it receives to select one of eight signals output by the VLRD. However, similar the VGRDs, of the eight VLRDs, only two are enabled by the selected two of the LVAS<8:1> signals. Sixteen interconnect lines carrying the eight output signals and their compliment signals of each VLRD extend vertically through corresponding decoded WL drivers. For example, output lines of VLRD 320-1 extend through and make electrical contacts in decoded WL drivers 324-1R and 324-1L.

The row selection in bank 1 is as follows. In response to bank 1 row addresses A<17:15> and A<14:12>, HGRD 314-B1 selects one of eight groups of global lines 315-B1-1 through 315-B1-8 and one of the eight signal lines in the selected one of the eight groups of global lines, respectively.

In response to bank 1 row addresses A<20:18> and A<11:9>, the enabled one of the bank 1 VGRDs selects one of the eight signals at its output. A corresponding bank 1 partial decoder 324-1P receives the selected one of the output signals from the enabled VGRD as well as the selected signal from the selected one of the eight groups of global lines 315-B1-i, and in response selects one of a number of groups of wordline drivers (not shown) in corresponding decoded wordline drivers 324-i-2 and 324-i-3. In response to bank 1 row addresses A<8:6>, the bank 1 VLRD corresponding to the enabled VGRD selects one of its eight output signals and its compliment. In response to the selected output signals of the VLRD, a wordline driver in the selected group of wordline drivers selects a corresponding wordline in each of the corresponding bank 1 sub-arrays 326-1L and 326-1R. The row selection in bank 2 occurs in a similar manner.

Though not explicitly shown, the horizontally-extending groups of global lines 315-B1-i, 315-B2-i and the vertically extending groups of signal lines 323-1 through 323-8 output by the eight VGRDs form a grid. Each partial decoder 324-1P receives a unique combination of signal lines 323-i and signal lines 315-B1-i, 315-B2-i to select a corresponding sector in a selected array. Decoded WL drivers 324-iR and 324-iL receive signal lines from corresponding VLRDs along with output signals from partial decoder 324-iP, and in response select a row of memory cells in the selected sector for a read or write operation.

Column predecoders CPD 312-B1, 312-B2 and column decoders CD 318-1 through 318-8 are shown along the bottom of FIG. 3A. CPD 312-B1 receives bank 1 column addresses A<5:0> and in response generates predecoded signals on PD-B1 bus for bank 1. Similarly, column predecoder CPD 312-B2 receives bank 2 column addresses A<5:0> and in response generates predecoded signals on PD-B2 bus for bank 2. Buses PD-B1 and PD-B2 extend horizontally below CDs 318-1 through 318-8. PD-B1 bus is coupled to CD 318-1, and depending on the desired bank partitioning may also be coupled to one or more of CDs 318-2 through 318-7. Similarly, PD-B2 bus is coupled to CD 318-8, and depending on the desired bank partitioning may also be coupled to one or more of CDs 318-7 through 138-2. Along the bottom of memory 300, similar to the top, dashed lines and dashed arrow lines along with circles and ovals are used to show mask optionable interconnections.

CDs 318-1 through 318-8 are coupled to bitlines in respective memory arrays. For example, CD 318-1 is coupled to the bitlines in array 326-1. Each CD 318 receives predecoded signals from one of buses PD-B1 and PD-B2 and in response selects a predetermined number of the 1,024 bitlines in the corresponding array. The predetermined number of selected bitlines equals the width of the output bus of memory 300, which is 16 bits wide in this example. In each memory access, two of the CDs 318-1 through 318-8 (one for each bank) would select 16 of the 1,024 bitlines in corresponding arrays. In this manner, 16 memory cells at the intersection of the selected wordline and the selected 16 bitlines in each of two (one for each bank) of the eight arrays are accessed in a memory access.

Array select predecoder (ASPD) 316 predecodes bank 1 and bank 2 row addresses A<20:18>, and outputs 8 high voltage array-select signals HVAS<8:1>. These eight signals are provided on eight interconnect lines extending horizontally along the bottom of FIG. 3A. In each access to memory 300, ASPD 316 functions to select two of the eight signals HVAS<8:1>. The two selected signals, in effect, respectively select one array from the array(s) in each of the two banks.

Figure 6:
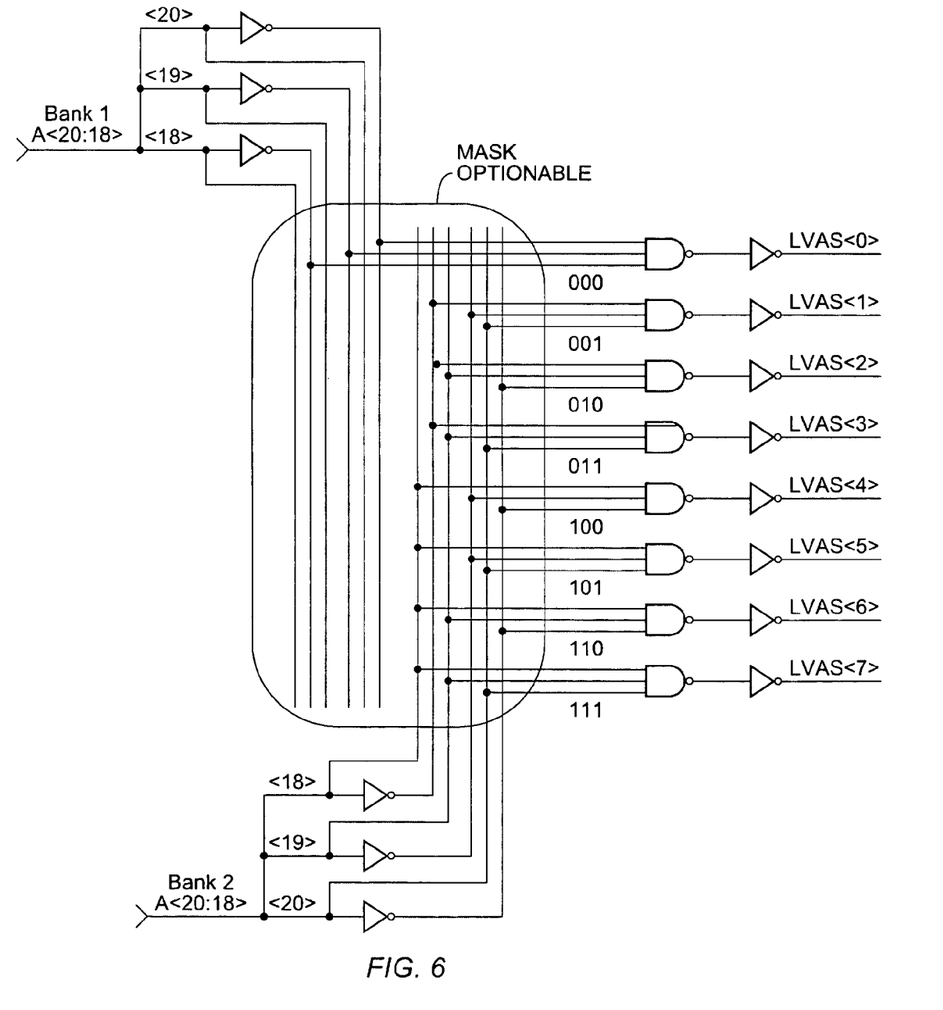
FIG. 6 shows an exemplary implementation of the portion of ASPD 316 in FIG. 3A generating the LVAS<8:1> signals.

The two selected arrays correspond to the same two arrays selected by low voltage array-select signals LVAS<8:1>. As indicated above, depending on the desired partitioning of the eight arrays between the two banks, an appropriate metal mask option is selected for ASPD 316. An exemplary implementation of the portion of ASPD 316 generating the LVAS<8:1> is shown in FIG. 6. This implementation corresponds to the metal option resulting in a 4 Mb bank 1 (i.e., bank 1 has array 324-1) and a 28 Mb bank 2 (i.e., bank 2 has arrays 324-2 through 324-8).

Figure 3B:
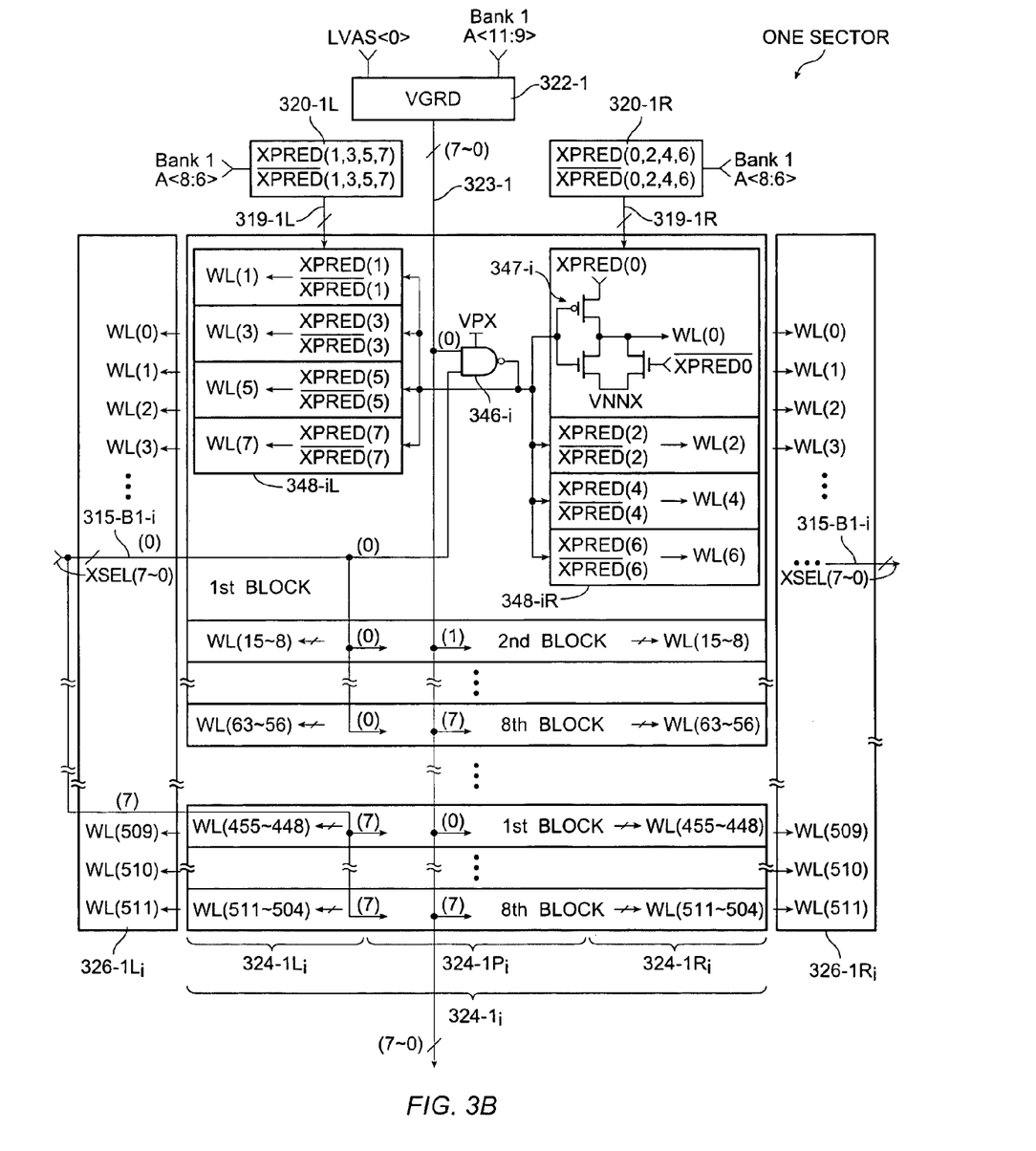
FIG. 3B shows one circuit implementation of one of eight sections of HLRD 324-1 in FIG. 3A.

FIG. 3B shows one circuit implementation of one of eight sections of HLRD 324-1 in FIG. 3A corresponding to one of eight sectors in array 326. The other seven sections of HLRD 324-1 are similar to that in FIG. 3B. Similarly, each of the other HLRDs 324-2 through 324-8 is made up of eight sections, each of the eight sections being similar to that shown in FIG. 3B. In FIG. 3B, in addition to a section 324-li of HLRD 324-1, its two adjacent sub-sectors 326-1Li and 326-2Ri are shown. Sub-sectors 326-1Li and 326-2Ri together form one of eight sectors in array 324-1 (subscript "i" in 326-1Li and 326-2Ri represents numbers 1 through 8 corresponding to sub-sectors 1 through 8). Each of the eight sections of HLRD 324-1 includes a partial decoder 324-1Pi along the center, a decoded WL driver 324-1Ri to the right of partial decoder 324-1Pi, and a decoded WL driver 324-1Li to the left of partial decoder 324-1Pi.

Partial decoder 324-1Pi includes one logic gate 346-i for every four wordlines (each of sub-sectors 326-1Ri, 326-1Li has 512 wordlines). These logic gates receive vertically-extending signal lines 323-1 generated by VGRD 322-1 and horizontally-extending signal lines 315-B1-i generated by HGRD 314-B1, and perform decode function on these. A two-input NAND gate is shown for logic gate 346-i. A four-transistor CMOS NAND implementation may be used for logic gate 346-i, however, other logic gates and transistor implementations may be used as would be obvious to one skilled in the art.

Each of decoded WL drivers 324-1Ri, 324-1Li includes one wordline driver 347-i per wordline. Wordline driver 347-i drives one wordline (e.g., WL<0>) in each of sub-sectors 326-1Li, 326-1Ri. The wordline drivers are arranged in groups of four, with two groups of four wordline drivers (e.g., groups 348-iR and 348-iL) having a common input terminal coupled to an output terminal of one logic gate 346-i.

Decoded WL drivers 324-1Ri, 324-1Li receive vertically-extending signal lines 319-1L, 319-1R generated by VLRDs 320-1L, 320-1R. Signal lines 319-1L, 319-1R carry true and compliment of each signal generated by the corresponding VLRDs 320-1L, 320-1R. Each wordline driver 347-i performs a decode function on the signal received from the corresponding logic gate 346-i and the set of true and complement signals received from the corresponding VLRDs 320-1L, 320-1R. Wordline driver 347-i is a three-transistor NOR gate, however, other logic gates and transistor implementations may be used as would be obvious to one skilled in the art.

Logic gate 346-i is coupled between supply voltage VPX and ground potential. Supply voltage VPX represents a multiplexed supply line which is biased to the supply voltage VCC (e.g., 1.8V supply or 3V supply) or to a boosted voltage (e.g., to 3V from a 1.8V supply, or to 5V from a 3V supply) during read operation, and to supply voltage VPP (e.g., +9V) during programming operation. VPP is generally greater than VCC, since higher array voltages are required during programming.

Each wordline driver 347-*i* includes a decoded-supply CMOS inverter and a decoded NMOS transistor which together function as a NOR gate. The decoded-supply CMOS inverter is coupled between one of predecoded signals 319-1L, 319-1R and supply voltage VNNX. Supply voltage VNNX represents a multiplexed supply line which can be biased to provide the necessary supply voltage during each of read, programming, and erase operations. The input terminal of the CMOS inverter is coupled to an output terminal of a corresponding logic gate 346-*i*, and the output terminal of the inverter is coupled to a wordline in each of sub-sectors 326-1Ri, 326-1Li. The decoded NMOS transistor of each wordline driver is coupled between the corresponding wordline and the supply voltage VNNX, and receives at its gate the complement of the same decode signal coupled to the supply terminal of the CMOS inverter.

HGRD 314-B1 provides eight groups of global signal lines 315-B1-1 through 315-B1-8 each having eight signal lines XSEL(7–0). Only one of these eight groups of global signal lines 315-B1-*i* is shown. Bank 1 addresses A<17:15> are decoded by HGRD 314-B1 to select one of the eight groups of global signal lines 315-B1-1 through 315-B1-8. The selected one of the eight groups of global signal lines in effect selects one of the eight sectors in each array in bank 1. Bank 1 addresses A<14:12> are decoded by HGRD 314-B1 to select one of the eight signal lines XSEL(7~0) in the selected group of global signal lines. The selected one of the eight signal lines XSEL(7~0) in effect selects 64 wordlines from the 512 wordlines in the selected sector. Bank 1 addresses A<11:9> are decoded by VGRD 322-1 to select one of the eight signal lines 323-1. The selected one of the eight signal lines in effect selects 8 wordlines from the selected 64 wordlines. Bank 1 addresses A<8:6> are decoded by VLRD 320-1L, 320-1R to select one of the eight signal lines XPRED (7~0) and its complement signal. The selected one of the eight signal lines XPRED (7~0) and its complement signal in effect select one wordline from the selected 8 wordlines. Bank 1 addresses A<20:18> are decoded by ASPD 316 (FIG. 3A) to select, via signal lines LVAS<7:0>, one of the array(s) in bank 1. The selected one of signal lines LVAS<7:0> in effect selects an array by enabling only one of the bank 1 VGRDs. An array and one of 4,096 wordlines within that array are selected in bank 2 in a similar manner.

Supply voltages VPX and VNNX, or variations thereof, are commonly used in EPROMs, EEPROMs, and flash EPROMs/EEPROMs to supply the requisite voltages to the array. However, the row decoding technique, in accordance with the present invention, is not limited to any particular type of memory, and can be modified by one of skilled in this art, in view of this disclosure, to be included in other types of semiconductor memories such as DRAMs and SRAMs. Also, the 32 Mb memory density in FIGS. 3A, 3B is only illustrative and not intended to be limiting. The memory architecture can be modified by one skilled in this art to implement any density and type of memory in view of the present disclosure.

Using a multi-layer metal process, in one embodiment, a first layer metal is used for the vertically-extending bitlines, a second layer metal is used for portions of the eight groups of lines 315-B1-*i*, 315-B2-*i* extending over the eight HLRDs, and a third layer metal is used for each of: (i) the portions of the eight groups of signal lines 315-B1-*i*, 315-B2-*i* extending over the sub-sectors, (ii) the eight groups of signal lines 323-*i* extending through the eight HLRDs 324-*i*, and (iii) the eight groups of signal lines generated by VLRDs 320-*i*. In another embodiment, the use of the second and third layers metal is reversed.

In an embodiment of the invention wherein memory 300 is a stand-alone 32 Mb memory chip, the memory chip has 21 address pins A0–A20, and the pin out is similar to a conventional 32 Mb memory. Simultaneous operation of the two banks, e.g., a read from bank 1 and a write to bank 2, would be carried out as follows. In a first clock cycle, address and control signals are latched in for bank 1 to carry out a read operation in bank 1, and in a subsequent clock cycle a new set of address and control signals along with write data are latched in for bank 2.

While the above is a complete description of the embodiments of the present invention, it is possible to use various alternatives, modifications and equivalents. For example, memory 100 (FIG. 1) may be a flash non-volatile memory, and during an erase operation a sector is selected for simultaneously erasing all cells in the selected sector. Further, the circuit diagrams are for depiction of the various circuit elements and do not necessarily limit the layout or other architectural aspects of the array. Also, whereas flexibility in partitioning has been described as being achieved by the selection from a plurality of preformed masks, the meaning of the word "masks," as used in this disclosure is intended to encompass, not just photomasks, but other pattern generating means as well. For example, reticules using steppers might also be used. Additionally, whereas the memory arrays of the preferred embodiments have been described as being split, in an alternative embodiment the arrays could be undivided, and to such undivided arrays the partitioning aspect of the present invention could be applied. Moreover, although a simultaneous operation dual-bank memory has been described, modifying the memory to obtain a simultaneous operation triple-bank or even greater would be obvious to one skilled in this art in view of this disclosure. Therefore, the scope of the present invention should be determined not with reference to the above description but should, instead, be determined with reference to the appended claim, along with their full scope of equivalents.

What is claimed is:

1. A semiconductor memory comprising:
    a plurality of memory arrays each having a plurality of memory cells arranged along rows and columns, the plurality of memory arrays being partitioned into first and second memory banks in correspondence with one of a plurality of mask options such that the first memory bank includes at least one but less than all of the plurality of memory arrays and the second memory bank includes a corresponding remainder of the plurality of memory arrays; and
    a row selection circuitry comprising:
        a first horizontal global row decoder configured to receive a first subset of addresses for the first memory bank and in response provide a first plurality of predecoded row address signals on a first plurality of lines extending only across the at least one but less than all of the plurality of memory arrays; and
        a second horizontal global row decoder configured to receive a first subset of addresses for the second memory bank and in response provide a second plurality of predecoded row address signals on a second plurality of lines extending only across the corresponding remainder of the plurality of memory arrays.

2. The semiconductor memory of claim 1 wherein the row selection circuitry further comprises an array select predecoder configured to receive a second subset of each of the addresses for the first and second memory banks in accordance with the one of a plurality of mask options and in response select one memory array in each of the first and second memory banks.

3. The semiconductor memory of claim 1 further comprises a column selection circuitry comprising:
   a first column predecoder configured to receive column addresses for the first memory bank and in response provide a first plurality of predecoded column address signals; and
   a second column predecoder configured to receive column addresses for the second memory bank and in response provide a second plurality of predecoded column address signals; and
   a plurality of column decoders each coupled to select a predetermined number of columns from one of the plurality of memory arrays,
   wherein in accordance with the one of a plurality of mask options:
      (i) at least one but less than all of the plurality of column decoders receive the first plurality of predecoded column address signals, and
      (ii) a corresponding remainder of the plurality of column decoders receive the second plurality of predecoded address signals.

4. The semiconductor memory of claim 3 further comprising an array select predecoder configured to receive addresses for each of the first and second memory banks in accordance with the one of a plurality of mask options and in response provide a plurality of output signals coupled to the plurality of column decoders so as to select one memory array in each of the first and second memory banks.

5. The semiconductor memory of claim 1 wherein the row selection circuitry further comprises:
   a plurality of horizontal local row decoders each being coupled to one of the plurality of memory arrays; and
   a plurality of vertical global row decoders each being coupled to one of the plurality of horizontal local row decoders, each of the plurality of vertical global row decoders being configured to provide a third plurality of predecoded row address signals on a third plurality of lines extending through a corresponding one of the plurality of horizontal local row decoders.

6. The semiconductor memory of claim 5 wherein each of the plurality of memory arrays is divided into a predetermined number of sectors each having a predetermined number of rows of memory cells, and the first and second plurality of lines form a grid with the corresponding third plurality of lines, the semiconductor memory further including a logic gate at every intersection of the grid for selecting a corresponding sector in the corresponding array.

7. The semiconductor memory of claim 5 wherein:
   a first one of the plurality of horizontal local row decoders selects a predetermined number of the plurality of rows in the array to which it is coupled in response to a unique combination of the first plurality of predecoded row address signals and the third plurality of predecoded row signals on the third plurality of lines extending through the first one of the plurality of horizontal local row decoders, and
   a second one of the plurality of horizontal local row decoders selects a predetermined number of the plurality of rows in the array to which it is coupled in response to a unique combination of the second plurality of predecoded row address signals and the third plurality of predecoded row address signals on the third plurality of lines extending through the second one of the plurality of horizontal local row decoders.

8. The semiconductor memory of claim 5 wherein each of the plurality of memory arrays is divided into a predetermined number of sectors each having a predetermined number of rows of memory cells, wherein:
   a first one of the plurality of horizontal local row decoders selects one of the predetermined number of sectors in the array to which it is coupled in response to a unique combination of the first plurality of predecoded row address signals and the third plurality of predecoded row address signals on the third plurality of lines extending through the first one of the plurality of horizontal local row decoders, and
   a second one of the plurality of horizontal local row decoders selects one of the predetermined number of sectors in the array to which it is coupled in response to a unique combination of the second plurality of predecoded row address signals and the third plurality of predecoded row address signals on the third plurality of lines extending through the second one of the plurality of horizontal local row decoders.

9. The semiconductor memory of claim 5 wherein the plurality of memory arrays are arranged along a row, and
   the first and second horizontal global row decoders are located along opposite sides of the row of plurality of memory arrays, and
   each of the plurality of horizontal local row decoders separates a corresponding memory array into two subarrays.

10. The semiconductor memory of claim 5 wherein the row selection circuitry further comprises a plurality of vertical local row decoders each being coupled to one of the plurality of horizontal local row decoders, each of the plurality of vertical local row decoders being configured to provide a fourth plurality of predecoded row address signals on a fourth plurality of lines extending through a corresponding one of the plurality of horizontal local row decoders.

11. The semiconductor memory of claim 10 wherein in accordance with the one of a plurality of mask options:
   (i) at least one but less than all of the plurality of vertical global row decoders receive a second subset of the addresses for the first memory bank, and a corresponding remainder of the vertical global row decoders receive a second subset of the addresses for the second memory bank, and
   (ii) at least one but less than all of the plurality of vertical local row decoders receive a third subset of the addresses for the first memory bank, and a corresponding remainder of the vertical local row decoders receive a third subset of the addresses for the second memory bank.

12. The semiconductor memory of claim 11 further comprising an array select predecoder configured to receive a fourth subset of each of the addresses for the first and second memory banks in accordance with the one of a plurality of mask options and in response provide a plurality of output signals coupled to the plurality of vertical global row decoders so as to select one memory array in each of the first and second memory banks.

13. The semiconductor memory of claim 10 wherein:
   a first one of the plurality of horizontal local row decoders selects a row in the array to which it is coupled in response to a unique combination of the first plurality of predecoded row address signals, the third plurality of predecoded row address signals on the third plurality of lines extending through the first one of the plurality of horizontal local row decoders, and the fourth plurality of predecoded row address signals on the fourth plurality of lines extending through the first one of the plurality of horizontal local row decoders, and a second one of the plurality of horizontal local row decoders selects a row in the array to which it is coupled in response to a unique combination of the second plurality of predecoded row address signals, the third plurality of predecoded row address signals on the third plurality of lines extending through the second one of the plurality of horizontal local row decoders, and the fourth plurality of predecoded row address signals on the fourth plurality of lines extending through the second one of the plurality of horizontal local row decoders.

14. The semiconductor memory of claim 10 wherein the first and second plurality of lines extend in a direction parallel to the rows of memory cells, and the third and fourth plurality of lines extend in a direction parallel to the columns of memory cells.

15. The semiconductor memory of claim 10 wherein the first one of the plurality of horizontal local row decoders comprises:
 a partial decoder configured to provide a plurality of output signals in response to a unique combination of the first plurality of predecoded row address signals and the third plurality of predecoded row address signals on the third plurality of lines extending through the first one of the plurality of horizontal local row decoders; and
 a final decoder configured to provide a plurality of output signals in response to the output signals of the partial decoder and the fourth plurality of predecoded row address signals on the fourth plurality of lines extending through the first one of the plurality of horizontal local row decoders.

16. The semiconductor memory of claim 10 wherein the first one of the plurality of horizontal local row decoders comprises:
 a partial decoder having a plurality of logic gates each coupled to receive a unique combination of the first plurality of predecoded row address signals and the third plurality of predecoded row address signals on the third plurality of lines extending through the first one of the plurality of horizontal local row decoders, and
 a final decoder having a plurality of decoded wordline drivers each comprising:
  an inverter coupled between a first supply voltage and one of the fourth plurality of predecoded row address signals on the fourth plurality of lines extending through the first one of the plurality of horizontal local row decoders, an input terminal of the inverter being coupled to an output terminal of one of the plurality of logic gates, and an output terminal of the inverter being coupled to a wordline in the corresponding array; and
  a transistor coupled between the first supply voltage and the wordline in the corresponding array, the transistor having a gate terminal coupled to another one of the fourth plurality of predecoded row address signals on the fourth plurality of lines extending through the first one of the plurality of horizontal local row decoders.

17. The semiconductor memory of claim 16 wherein the first supply voltage is set to a voltage in the range of 1.8V to 5V during read operation, 6V to 10V during program operation, and −6V to −10V during erase operation.

18. The semiconductor memory of claim 16 wherein each of the plurality of logic gates performs an AND function.

19. The semiconductor memory of claim 1 wherein each of the plurality of mask options corresponds to a different partitioning of the memory arrays into the first and second memory banks.

20. The semiconductor memory of claim 1 wherein memory operations can be carried out simultaneously in the first and second memory banks.

21. The semiconductor memory of claim 1 further comprising a column selection circuitry coupled to select columns of cells in each of the first and second memory banks in response to column addresses,
 wherein each of the plurality of mask options configures the row and column selection circuitries to obtain a different partitioning of the plurality of memory arrays into the first and second memory banks.

22. The semiconductor memory of claim 21 wherein the row and column selection circuitries respectively receive a first row address and a first column address for accessing one or more memory cells in the first memory bank, and the row and column selection circuitries respectively receive a second row address and a second column address for simultaneously accessing one or more memory cells in the second memory bank.

23. The semiconductor memory of claim 1 wherein the semiconductor memory receives a first bank address and a second bank address, the first bank address including row and column addresses for accessing one or more memory cells in the first memory bank, and the second bank address including row and column addresses for accessing one or more memory cells in the second memory bank.

24. The semiconductor memory of claim 1 wherein the one of a plurality of mask options corresponds to one of a plurality of metal masks used to form a metal layer in the semiconductor.

25. A semiconductor memory comprising:
 a plurality of memory arrays each having a plurality of sectors, each sector having a plurality of memory cells arranged along rows and columns;
 reconfigurable address decode circuitry coupled to access memory cells in the plurality of memory arrays in response to row and column addresses, wherein the plurality of memory arrays are partitioned into first and second memory banks by configuring the address decode circuitry into one of a plurality of mask-selectable configurations such that the first memory bank includes at least one but less than all of the plurality of memory arrays and the second memory bank includes a corresponding remainder of the plurality of memory arrays, and each of the mask-selectable configurations corresponds to one of a plurality of metal masks used to form a metal layer in the semiconductor, the address decode circuitry comprising:
  an array select predecoder configured to select a first memory array in the first memory bank in response to a first subset of a first bank address, and a second memory array in the second memory bank in response to a first subset of a second bank address;
  a first horizontal global row decoder configured to provide a first plurality of predecoded row address signals in response to a second subset of the first bank address;

a second horizontal global row decoder configured to provide a second plurality of predecoded row address signals in response to a second subset of the second bank address;

a plurality of horizontal local row decoders each coupled to one of the plurality of memory arrays, wherein:

the horizontal local row decoder coupled to the selected first memory array selects a sector in the selected first memory array in response to the first plurality of predecoded row address signals, and the horizontal local row decoder coupled to the selected second memory array selects a sector in the selected second memory array in response to the second plurality of redecoded row address signals; and a plurality of vertical global row decoders each coupled to one of the plurality of horizontal local row decoders, at least one but less than all of the plurality of vertical global row decoders being configured to provide a third plurality of predecoded row address signals in response to a third subset of the first bank address, and a corresponding remainder of the vertical global row decoders being configured to provide a fourth plurality of predecoded row address signals in response to a third subset of the second bank address.

26. A semiconductor memory comprising:

a plurality of memory arrays each having a plurality of memory cells arranged along rows and columns;

reconfigurable address decode circuitry coupled to access memory cells in the plurality of memory arrays in response to row and column addresses, wherein each of a plurality of metal mask options configures the reconfigurable address decode circuitry to obtain a different partitioning of the plurality of memory arrays into first and second memory banks such that for each of the plurality of metal masks the first memory bank includes at least one but less than all of the plurality of memory arrays and the second memory bank includes a corresponding remainder of the plurality of memory arrays, the reconfigurable address decode circuitry comprising:

an array select predecoder configured to select a first memory array in the first memory bank in response to a first subset of a first bank address, and a second memory array in the second memory bank in response to a first subset of a second bank address;

a first horizontal global row decoder configured to provide a first plurality of predecoded row address signals in response to a second subset of the first bank address;

a second horizontal global row decoder configured to provide a second plurality of predecoded row address signals in response to a second subset of the second bank address;

a plurality of horizontal local row decoders each coupled to one of the plurality of memory arrays;

a plurality of vertical global row decoders each coupled to one of the plurality of horizontal local row decoders, at least one but less than all of the plurality of vertical global row decoders being configured to provide a third plurality of predecoded row address signals in response to a third subset of the first bank address, and a corresponding remainder of the vertical global row decoders being configured to provide a fourth plurality of predecoded row address signals in response to a third subset of the second bank address; and a plurality of vertical local row decoders each coupled to one of the plurality of horizontal local row decoders, at least one but less than all of the plurality of vertical local row decoders being configured to provide a fifth plurality of predecoded row address signals in response to a fourth subset of the first bank address, and a corresponding remainder of the vertical local row decoders being configured to provide a sixth plurality of predecoded row address signals in response to a fourth subset of the second bank address the horizontal local row decoder coupled to the selected first memory array selects a row in the selected first memory array in response to a unique combination of the first, third, and fifth plurality of predecoded decoded row address signals, and the horizontal local row decoder coupled to the selected second memory array selects a row in the selected second memory array in response to a unique combination of the second, fourth, and sixth plurality of predecoded row address signals.

27. A method of operating a semiconductor memory having a plurality of memory arrays partitioned into first and second memory banks in correspondence with one of a plurality of mask options such that the first memory bank includes at least one but less than all of the plurality of memory arrays and the second memory bank includes a corresponding remainder of the plurality of memory arrays, each of the plurality of memory arrays having a plurality of memory cells arranged along rows and columns, the method comprising:

generating a first plurality of predecoded row address signals on a first plurality of lines extending only across the at least one but less than all of the plurality of memory arrays in response to a first subset of addresses for the first memory bank being provided to a first horizontal global row decoder; and generating a second plurality of predecoded row address signals on a second plurality of lines extending only across the corresponding remainder of the plurality of memory arrays in response to a first subset of addresses for the second memory bank being provided to a second horizontal global row decoder.

28. The method of claim 27 further comprising:

selecting one memory array in each of the first and second memory banks in response to a second subset of each of the addresses for the first and second memory banks being provided to an array select predecoder in accordance with the one of a plurality of mask options and in response.

29. The method of claim 28 wherein the semiconductor memory further comprises a plurality of column decoders each coupled to one of the plurality of memory arrays, the method further comprising:

generating a first plurality of predecoded column address signals in response to column addresses for the first memory bank being provided to a first column predecoder;

generating a second plurality of predecoded column address signals in response to column addresses for the second memory bank being provided to a second column predecoder;

selecting a predetermined number of columns in the selected memory array in the first memory bank in response to the first plurality of predecoded column address signals being provided to at least one but less than all of the plurality of column decoders; and selecting a predetermined number of columns in the selected memory array in the second memory bank in response to the second plurality of predecoded column address signals being provided to a corresponding remainder of the plurality of column decoders.

30. The method of claim 28 wherein the semiconductor memory comprises a plurality of horizontal local row decoders each coupled to one of the plurality of memory arrays, a plurality of vertical global row decoders each being coupled to one of the plurality of horizontal local row decoders, and a plurality of vertical local row decoders each being coupled to one of the plurality of horizontal local row decoders, the method further comprising:

generating a third plurality of predecoded row address signals in response to a second subset of the addresses for the first memory bank being provided to at least one but less than all of the plurality of vertical global row decoders;

generating a fourth plurality of predecoded row address signals in response to a second subset of the addresses for the second memory bank being provided to a corresponding remainder of the vertical global row decoders;

generating a fifth plurality of predecoded row address signals in response to a third subset of the addresses for the first memory bank being provided to at least one but less than all of the plurality of vertical local row decoders;

generating a sixth plurality of predecoded row address signals in response to a third subset of the addresses for the second memory bank being provided to a corresponding remainder of the vertical local row decoders;

selecting a row in the selected memory array in the first memory bank in response to a unique combination of the first, third, and fifth plurality of predecoded row address signals being provided to the horizontal local row decoder coupled to the selected memory array in the first memory bank; and selecting a row in the selected memory array in the second memory bank in response to a unique combination of the second, fourth, and sixth plurality of predecoded row address signals being provided to the horizontal local row decoder coupled to the selected memory array in the second memory bank.

31. The method of claim 28 wherein the semiconductor memory comprises a plurality of horizontal local row decoders each coupled to one of the plurality of memory arrays, and a plurality of vertical global row decoders each being coupled to one of the plurality of horizontal local row decoders, and each of the plurality of memory arrays is divided into a predetermined number of sectors each having a predetermined number of rows of memory cells, the method further comprising:

generating a third plurality of predecoded row address signals in response to a second subset of the addresses for the first memory bank being provided to at least one but less than all of the plurality of vertical global row decoders;

generating a fourth plurality of predecoded row address signals in response to a second subset of the addresses for the second memory bank being provided to a corresponding remainder of the vertical global row decoders;

selecting one of the predetermined number of sectors in the selected memory array in the first memory bank in response to a unique combination of the first plurality of predecoded row address signals and the third plurality of predecoded row address signals being provided to the horizontal local row decoder coupled to the selected memory array in the first memory bank; and selecting one of the predetermined number of sectors in the selected memory array in the second memory bank in response to a unique combination of the second plurality of predecoded row address signals and the fourth plurality of predecoded row address signals being provided to the horizontal local row decoder coupled to the selected memory array in the second memory bank.

32. The method of claim 27 further comprising:

accessing the first memory bank to perform a first memory operation in the first memory bank; and accessing the second memory bank to perform a second memory operation in the second memory bank, wherein the first and second memory operations overlap in time.

33. The method of claim 27 further comprising:

accessing one or more memory cells in the first memory bank in response to a first bank address including row and column addresses; and simultaneously accessing one or more memory cells in the second memory bank in response to a second bank address including row and column addresses.

34. The method of claim 27 wherein the one of a plurality of mask options corresponds to one of a plurality of metal masks used to form a metal layer in the semiconductor.

35. A method of forming a semiconductor memory having a plurality of memory arrays and a row selection circuitry comprising a first horizontal global row decoder configured to provide a first plurality of predecoded row address signals on a first plurality of lines, and a second horizontal global row decoder configured to provide a second plurality of predecoded row address signals on a second plurality of lines, the method comprising:

applying one of a plurality of mask options to partition the plurality of memory arrays into first and second memory banks such that:

(i) the first memory bank includes at least one but less than all of the plurality of memory arrays and the second memory bank includes a corresponding remainder of the plurality of memory arrays, and (ii) the first plurality of lines extend only across the at least one but less than all of the plurality of memory arrays, and the second plurality of lines extend only across the corresponding remainder of the plurality of memory arrays.

36. The method of claim 35 wherein the semiconductor memory further includes first and second column predecoded respectively configured to provide first and second plurality of predecoded column address signals, and a plurality of column decoders each coupled to select a predetermined number of columns from one of the plurality of memory arrays, wherein in accordance with said applying one of a plurality of mask options:

(i) at least one but less than all of the plurality of column decoders receive the first plurality of predecoded column address signals, and (ii) a corresponding remainder of the plurality of column decoders receive the second plurality of predecoded address signals.

37. The method of claim 35 wherein the row selection circuitry further comprises a plurality of horizontal local row decoders each being coupled to one of the plurality of memory arrays, a plurality of vertical global row decoders each being coupled to one of the plurality of horizontal local row decoders, and a plurality of vertical local row decoders each being coupled to one of the plurality of horizontal local row decoders,     wherein in accordance with said applying one of a plurality of mask options:
        (i) at least one but less than all of the plurality of vertical global row decoders receive a second subset of the addresses for the first memory bank and a corresponding remainder of the vertical global row decoders receive a second subset of the addresses for the second memory bank, and
        (ii) at least one but less than all of the plurality of vertical local row decoders receive a third subset of the addresses for the first memory bank and corresponding remainder of the vertical local row decoders receive a third subset of the addresses for the second memory bank.

38. The method of claim 35 wherein each of the plurality of mask options corresponds to a different partitioning of the memory arrays into the first and second memory banks.

39. The method of claim 35 wherein memory operations can be carried out simultaneously in the first and second memory banks.

40. The method of claim 35 wherein the plurality of mask options is a plurality of metal mask options.

41. A method of manufacturing a semiconductor memory having row and column selection circuits coupled to a plurality of memory arrays, the method comprising:

applying one of a plurality of metal masks to form a metal layer and to configure the row and column select circuits to obtain a desired partitioning of the plurality of memory arrays into first and second memory banks such that the first memory bank includes at least one but less than all of the plurality of memory arrays and the second memory bank includes a corresponding remainder of the plurality of memory arrays,     wherein each of the plurality of metal masks corresponds to a different configuration of the row and column selection circuits, and each of the different configurations of the row and column selection circuits correspond to a different partitioning of the plurality of memory arrays into the first and second memory banks.

\* \* \* \* \*